(12) United States Patent
Soncini et al.

(10) Patent No.: US 11,107,985 B2
(45) Date of Patent: Aug. 31, 2021

(54) MATERIALS AND COMPONENTS IN PHASE CHANGE MEMORY DEVICES

(71) Applicant: Intel Corporation, Santa Clara, CA (US)

(72) Inventors: Valter Soncini, Sesto San Giovanni (IT); Davide Erbetta, Vimercate (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/702,358

(22) Filed: Dec. 3, 2019

(65) Prior Publication Data

US 2020/0168794 A1 May 28, 2020

Related U.S. Application Data

(63) Continuation of application No. 15/683,636, filed on Aug. 22, 2017, now Pat. No. 10,497,870, which is a
(Continued)

(51) Int. Cl.
*H01L 45/00* (2006.01)
*H01L 27/24* (2006.01)
*G11C 11/56* (2006.01)

(52) U.S. Cl.
CPC ...... *H01L 45/1253* (2013.01); *G11C 11/5678* (2013.01); *G11C 11/5685* (2013.01); *H01L 27/2427* (2013.01); *H01L 27/2463* (2013.01); *H01L 45/00* (2013.01); *H01L 45/04* (2013.01); *H01L 45/06* (2013.01); *H01L 45/122* (2013.01); *H01L 45/1233* (2013.01); *H01L 45/14* (2013.01); *H01L 45/143* (2013.01);
(Continued)

(58) Field of Classification Search
CPC ............. H01L 27/2427; H01L 27/2463; H01L 27/2481; H01L 45/04; H01L 45/06; H01L 45/12; H01L 45/122; H01L 45/1233; H01L 45/1253; H01L 45/141; H01L 45/14; H01L 45/00; H01L 45/1625; H01L 45/143; H01L 45/144; H01L 45/148; H01L 45/16; G11C 11/5678; G11C 11/5685; G11C 13/0004; G11C 13/0007
See application file for complete search history.

(56) References Cited

U.S. PATENT DOCUMENTS 9,299,747 B1   3/2016   Pellizzer et al.
9,419,212 B2   8/2016   Petz et al.
(Continued)

FOREIGN PATENT DOCUMENTS

DE   10297015   10/2004
DE   10297784   7/2005
(Continued)

OTHER PUBLICATIONS

Japanese and English Translation of Japanese Office Action for Patent Application No. 2017-541946, dated May 14, 2020, 5 pages.
(Continued)

*Primary Examiner* — Eduardo A Rodela
(74) *Attorney, Agent, or Firm* — Compass IP Law, PC

(57) ABSTRACT

Phase change memory cells, structures, and devices having a phase change material and an electrode forming an ohmic contact therewith are disclosed and described. Such electrodes can have a resistivity of from 10 to 100 mOhm·cm.

17 Claims, 5 Drawing Sheets

Related U.S. Application Data continuation of application No. 14/671,204, filed on Mar. 27, 2015, now Pat. No. 9,741,930.

(52) U.S. Cl.
CPC .......... *H01L 45/144* (2013.01); *H01L 45/148* (2013.01); *H01L 45/16* (2013.01); *H01L 45/1625* (2013.01)

(56) References Cited

U.S. PATENT DOCUMENTS

| | | |
|---|---|---|
| 9,741,930 B2 | 8/2017 | Soncini et al. |
| 2002/0038872 A1 | 4/2002 | Lowrey et al. |
| 2003/0027398 A1 | 2/2003 | Maimon et al. |
| 2004/0115372 A1 | 6/2004 | Lowrey |
| 2006/0097240 A1 | 5/2006 | Lowrey et al. |
| 2006/0113573 A1* | 6/2006 | Cheong ............... H01L 45/1233 257/246 |
| 2006/0266993 A1 | 11/2006 | Suh et al. |
| 2007/0035030 A1 | 2/2007 | Horton et al. |
| 2007/0096072 A1* | 5/2007 | Dodge ................... H01L 45/16 257/2 |
| 2008/0078984 A1 | 4/2008 | Park et al. |
| 2008/0113464 A1 | 5/2008 | Savransky |
| 2009/0166601 A1* | 7/2009 | Czubatyj ............. H01L 45/1233 257/3 |
| 2010/0008122 A1* | 1/2010 | Tilke ................... H01L 27/2445 365/148 |
| 2012/0100725 A1* | 4/2012 | Kikuchi ................ C23C 16/511 438/762 |
| 2013/0228737 A1 | 9/2013 | Fukumizu et al. |
| 2013/0235646 A1 | 9/2013 | Nojiri et al. |
| 2014/0145140 A1 | 5/2014 | Kim |
| 2014/0166966 A1 | 6/2014 | Nishioka et al. |
| 2014/0239245 A1 | 8/2014 | Lengade et al. |
| 2015/0162381 A1 | 6/2015 | Tour et al. |
| 2016/0064659 A1 | 3/2016 | Cho et al. |
| 2016/0064666 A1* | 3/2016 | Chan ..................... H01L 45/145 257/4 |
| 2016/0163975 A1 | 6/2016 | Petz et al. |

FOREIGN PATENT DOCUMENTS

| | | |
|---|---|---|
| DE | 102011101192 A1 | 12/2011 |
| JP | 2006508255 A | 3/2006 |
| JP | 2006339642 A | 12/2006 |
| JP | 2011523503 A | 8/2011 |
| JP | 2013236079 A | 11/2013 |
| TW | 200633204 A | 9/2006 |
| TW | 201508773 A | 3/2015 |
| WO | 2013032983 A1 | 3/2013 |

OTHER PUBLICATIONS

First Office Action for U.S. Appl. No. 14/671,204, dated Jun. 16, 2016, 9 pages.
First Office Action for U.S. Appl. No. 15/683,636, dated Jul. 5, 2018, 14 pages.
German First Office Action for Patent Application No. 102016103493. 2, dated Oct. 22, 2019, 8 pages.
International Preliminary Report on Patentability for PCT Patent Application No. PCT/US2016/019991, dated Oct. 3, 2017, 11 pages.
International Search Report and Written Opinion for PCT Patent Application No. PCT/US2016/019991, dated May 18, 2016, 16 pages.
Korean and English Translation of Korean First Office Action for Patent Application No. 10-2016-0022715, dated Apr. 17, 2017, 6 pages.
Korean and English Translation of Korean Second Office Action for Patent Application No. 10-2016-0022715, dated Oct. 18, 2017, 4 pages.
Restriction Requirement for U.S. Appl. No. 14/671,204, dated Feb. 26, 2016, 7 pages.
Restriction Requirement for U.S. Appl. No. 15/683,636, dated Mar. 28, 2018, 7 pages.
Second Office Action for U.S. Appl. No. 14/671,204, dated Dec. 13, 2016, 6 pages.
Second Office Action for U.S. Appl. No. 15/683,636, dated Mar. 11, 2019, 17 pages.
Taiwanese and English Translation of Taiwan IPO Search Report for Patent Application No. 105104807, dated Mar. 1, 2017, 16 pages.

\* cited by examiner

MATERIALS AND COMPONENTS IN PHASE CHANGE MEMORY DEVICES

PRIORITY DATA

This application is a continuation of U.S. patent application Ser. No. 15/683,636, filed Aug. 22, 2017, now issued as U.S. Pat. No. 10,497,870, which is a continuation of U.S. patent application Ser. No. 14/671,204, filed on Mar. 27, 2015, now issued as U.S. Pat. No. 9,741,930, which is incorporated herein by reference.

BACKGROUND

Phase change memory is a type of non-volatile random-access memory that utilizes a detectable change in the physical state of a material as an information storage medium. For example, the phase change of a material from an amorphous state to a crystalline state or vice versa can be induced and then detected in order to store and then retrieve information. As a simplified example, a chalcogenide material can be heated and cooled in a manner that solidifies the material in an amorphous state, or the chalcogenide material can be heated and cooled in a manner that solidifies the material in a crystalline state. Other specific heating and cooling protocols may be employed to result in solidification of the chalcogenide material at different specific degrees of crystallinity across the spectrum between completely amorphous and completely crystalline states.

The solidified state of the phase change material is non-volatile, and thus is retained until reprogrammed, whether solidified to a crystalline, semi-crystalline, amorphous, or semi-amorphous state. This is due to the fact that, once solidified, the state of the material is not dependent upon electrical power.

DESCRIPTION OF EMBODIMENTS

Figure 1:
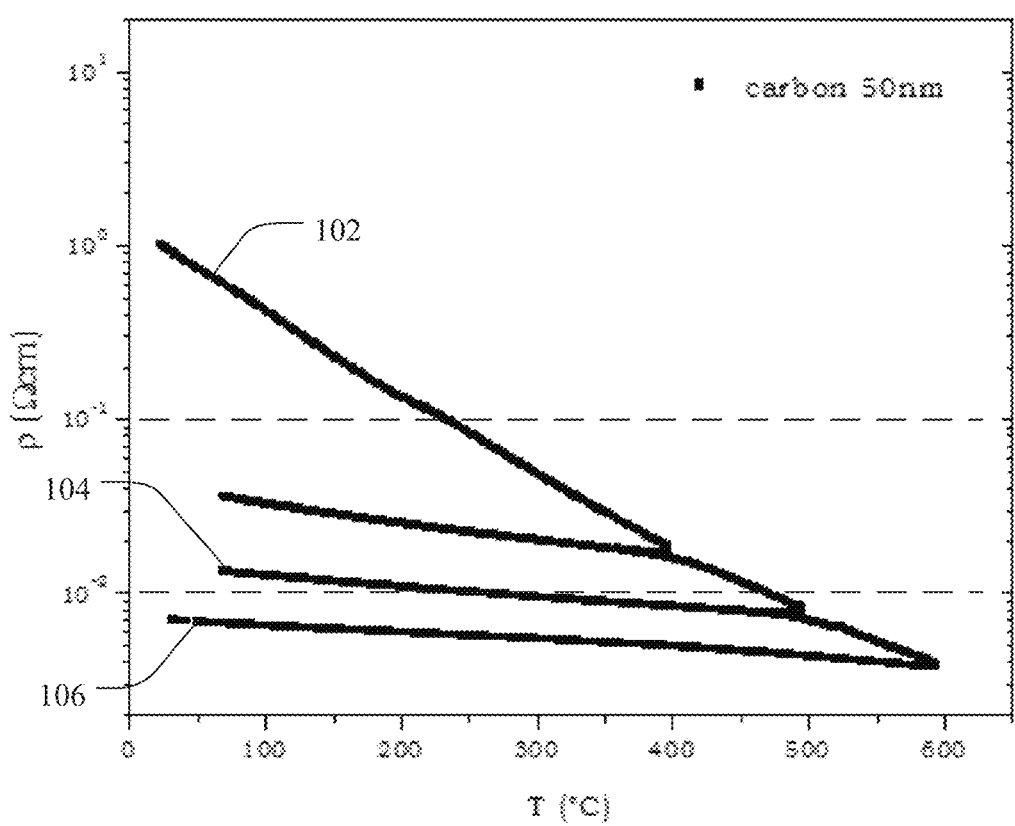
FIG. 1 is a graphical representation of resistivity characteristics of amorphous carbon materials.

Although the following detailed description contains many specifics for the purpose of illustration, a person of ordinary skill in the art will appreciate that many variations and alterations to the following details can be made and are considered to be included herein.

Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

As used in this specification and the appended claims, the singular forms "a," "an" and "the" include plural referents unless the context clearly dictates otherwise. Thus, for example, reference to "a layer" includes a plurality of such layers.

In this specification, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term, like "comprising" or "including," it is understood that direct support should be afforded also to "consisting essentially of" language as well as "consisting of" language as if stated explicitly and vice versa.

"The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects or structures described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, "a select device material" can refer to a number of materials acceptable for use in a phase change memory structure or device, and may be determined by the required function or desired properties thereof. In one example, a select device material may be a phase change material. Such material may be the same as, similar to, or different than, a phase change material of a cell used to record and store information.

In another aspect, such material may be a conductor, semiconductor, or dielectric material. Such materials may be selected as needed to perform an intended function for its location in the device.

As used herein, "enhanced," "improved," "performance-enhanced," "upgraded," and the like, when used in connection with the description of a device or process, refers to a characteristic of the device or process that provides measurably better form or function as compared to previously known devices or processes. This applies both to the form and function of individual components in a device or process, as well as to such devices or processes as a whole.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.8, 3, 3.1, 4, 4.7, and 5, individually.

This same principle applies to ranges reciting only one numerical value as a minimum or a maximum. Furthermore, such an interpretation should apply regardless of the breadth of the range or the characteristics being described.

As used herein, unless otherwise stated, numerical values as applied to the content of a material in a composition of materials, including numerical values relative to one another, such as ratios, can be considered to be measured in atomic % (i.e. at %).

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

EXAMPLE EMBODIMENTS

An initial overview of technology embodiments is provided below and specific technology embodiments are then described in further detail. This initial summary is intended to aid readers in understanding the technology more quickly but is not intended to identify key or essential technological features, nor is it intended to limit the scope of the claimed subject matter.

Phase change memory cells or structures typically include a number of components in order to operate. For example, a material that changes and holds a phase under induced conditions, electrodes that provide electrical access to the phase change material, and dielectric layers insulating between phase change materials are all typical phase change memory components. It can be beneficial for electrodes that contact phase change materials, for example chalcogenide materials, to have certain properties across all, or substantially all, of the desired range of operating temperatures. Such temperatures can range, for example, from about room temperature to the melting point of the phase change material, which can be about 600° C. Such high programming and erase temperatures can be performed many thousands of times, and thus can result in degraded performance of the device over time.

The material composition of an electrode material can greatly affect the performance of such a memory cell or structure, and thus the performance of a memory device into which such a memory cell is incorporated. Exemplary non-limiting properties of a desirable electrode material can include: 1) remaining in, or otherwise maintaining, an amorphous state to control the roughness of the electrode material; 2) maintaining a stable resistance within a desired range, particularly throughout the working lifespan of a device; 3) forming a low resistance ohmic contact with the phase change material; and 4) having a low thermal conductivity to prevent or limit thermal dissipation during programming operations (i.e. changing the phase of the phase change material). Other desirable properties can include a good mechanical adhesion with the phase change material, being chemically stable or inert with respect to the phase change material to avoid a chemical reaction therewith, and preventing or limiting the diffusion of elements through the electrode to prevent or limit undesired contamination of cell materials.

One electrode material for phase change memory is amorphous carbon, which can be deposited in some cases by a physical vapor deposition (PVD) technique. While amorphous carbon electrodes have many desirable properties, certain properties are lacking, and thus can, in at least some cases, negatively affect the performance of the phase change memory cell. For example, amorphous carbon materials evolve under thermal budget (e.g. during cell programming operations, back end integration, and the like). This evolution of the carbon electrode results in performance drift that may be primarily due to the rearrangement of the carbon lattice with an increase of sp2 aromatic clusters in the electrode layer. As another example, the resistance of the amorphous carbon material after stabilization can be significantly below what is optimal for good performance. Furthermore, the resistivity of amorphous carbon materials decreases as temperatures increase. From a performance standpoint, it is more desirable for the resistivity of the electrode material to increase with increasing temperature. Amorphous carbon materials can show a high roughness, which can be sensitive to process conditions during deposition, and as such can negatively affect device performance.

FIG. 1 shows the resistivity of amorphous carbon material measured from about room temperature to about 600° C. following various thermal anneals. For reference, electrode materials during manufacture typically undergo a thermal budget of approximately 400° C., depending on the materials involved and the manufacturing process. The region between the horizontal dashed lines represents a range of resistivity from 10 mOhm·cm to 100 mOhm·cm. FIG. 1 shows the resistivity of amorphous carbon as deposited 102, following a 3 hour 400° C. anneal 104, and after a 3 hour 600° C. anneal.

The aforementioned limitations and disadvantages can be overcome or otherwise mitigated through the use of various novel electrode materials. Three examples of such materials include silicon-doped amorphous carbon, nitrogen-doped tungsten silicide ($WSi_x$), and tungsten-doped silicon carbide. Utilizing such electrode materials in phase change memory cells can provide superior performance and operation as compared to amorphous carbon electrodes.

Accordingly, in one example a phase change memory structure is provided that includes a phase change material of a memory cell, an electrode material forming an ohmic contact with the phase change material, and a dopant dispersed within the electrode material such that the doped electrode material has a resistivity of from about 10 to about 100 mOhm·cm. In one example, the doped electrode material has a resistivity of from about 10 to about 100 mOhm·cm when measured at a temperature of about 600° C. In another example, the doped electrode material has a resistivity of from about 10 to about 100 mOhm·cm when measured at a temperature of about 20° C. In yet another example, the doped electrode material has a resistivity of from about 10 to about 100 mOhm·cm when measured at a temperature of from about 400° C. to about 800° C. In a further example, the doped electrode material has a resistivity of from about 10 to about 100 mOhm·cm when measured at a temperature of from about 20° C. to about 400° C. In yet a further example, the doped electrode material has a resistivity of from about 10 to about 100 mOhm·cm when measured at a temperature of about 20° C. and at a temperature of about 600° C.

Furthermore, in some examples the doped electrode material has a resistivity of from about 10 to about 100 mOhm·cm as formed. Thus, in contrast to amorphous carbon electrode materials, the doped electrode material has a resistivity that is within the about 10 to about 100 mOhm·cm range as deposited. In another example, the doped electrode has a resistivity of from about 10 to about 100 mOhm·cm following manufacturing. In one aspect, the resistivity of from about 10 to about 100 mOhm·cm can be following manufacturing, but before use (e.g. performing any write functions). As has been described, electrode materials in general undergo a thermal budget of approximately 400° C. during the manufacturing process. In another example, the doped electrode has a resistivity of from about 10 to about 100 mOhm·cm following a 3 hour 400° C. anneal. In yet another example, the doped electrode has a resistivity of from about 10 to about 100 mOhm·cm following a 3 hour 500° C. anneal. In a further example, the doped electrode has a resistivity of from about 10 to about 100 mOhm·cm following a 3 hour 600° C. anneal. Additionally, in another example the doped electrode has a resistivity of from about 10 to about 100 mOhm·cm following at least 1000 write and erase cycles.

Figure 2:
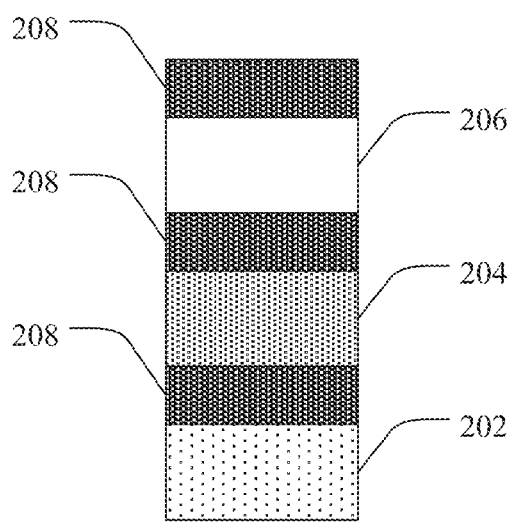
FIG. 2 is a schematic view of a phase change memory cell in accordance with an invention embodiment.

FIG. 2 shows one exemplary phase change memory cell or structure configuration. The memory cell can include a word line 202 or other structure whereby the memory cell is incorporated into a memory device. The memory cell also includes a select device material 204 and a phase change material 206. Electrodes 208 are positioned on at least two sides of the select device material 204 and the phase change material 206, and thus ohmic contacts are formed between each of these material layers and the associated electrodes. One or more of the electrode positions shown in FIG. 2 can include the doped electrode material. In some examples, one or both electrodes contacting the phase change material 206 can include the doped electrode material. In other examples, one or more of the electrodes contacting the select device material 204 can include the doped electrode material. In yet other examples, all electrodes contacting either the phase change material 206 or the select device material 204 can include the doped electrode material.

It is noted that, in an alternative arrangement, the order of the select device material and the phase change material can be reversed, such that the phase change material is closer to the word line than the select device material.

Figure 3:
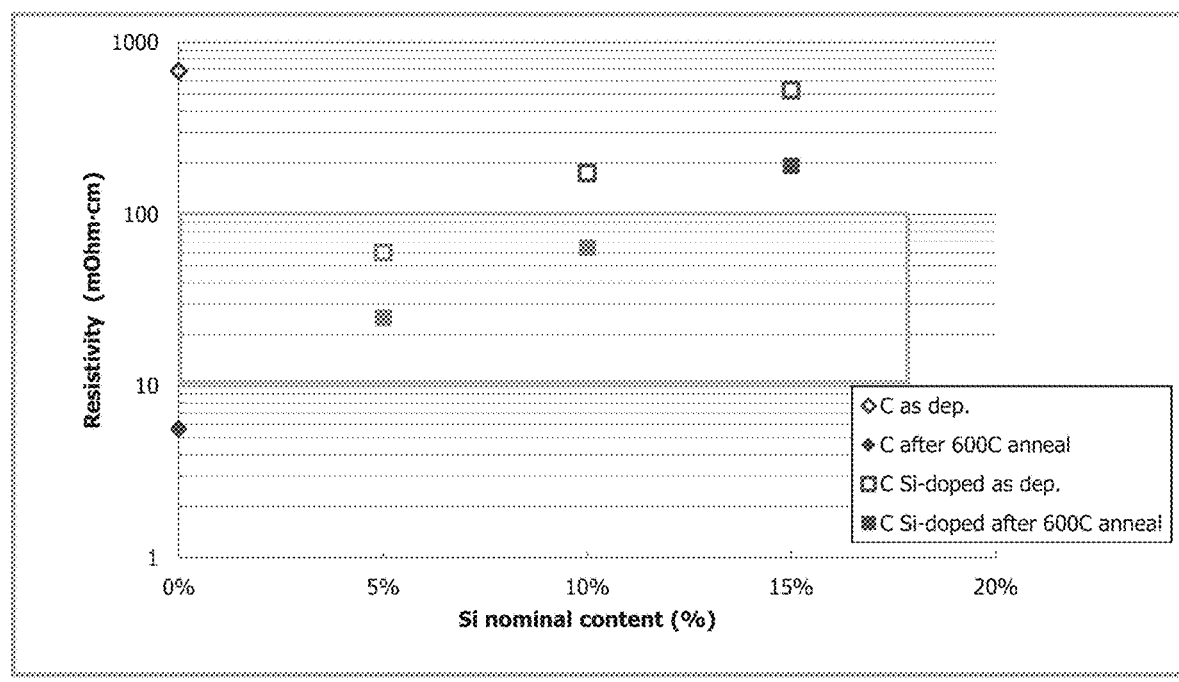
FIG. 3 is a graphical representation of data in accordance with an invention embodiment.

As has been described, various doped electrode materials can be utilized. In one example, the doped electrode material can be a silicon-doped amorphous carbon material. FIG. 3 shows a comparison of electrical properties between undoped amorphous carbon (C) and silicon-doped amorphous carbon. The shaded box represents a target resistance range of from 10 mOhm·cm to 100 mOhm·cm. Both the amorphous carbon as deposited (open diamond) and the amorphous carbon after a 600° C. anneal (solid diamond) have resistivity values that are outside of the target range. Silicon-doped amorphous carbon materials, both as deposited (open square) and after a 600° C. anneal (solid square), have resistivity values that are within the target range for various silicon at % values.

The content of the silicon dopant in the amorphous carbon can include any atomic ratio that results in a material that has enhanced resistivity as compared to undoped amorphous carbon. In one example the silicon can be doped in the amorphous carbon in an amount up to about 20 at %. In another example, the silicon can be doped in the amorphous carbon from about 5 at % to about 10 at %. It is noted that the "up to" terminology recited in a range is understood to have a lower limit. Specifically, recitation of an element in a composition in an amount of "up to" a certain number necessarily requires some minimal amount of such element due to the fact that it was positively recited as an element of the composition. Moreover, one skilled in the art would understand that such a range pertains to the introduction of a dopant into another material, which necessarily implies that some amount of material is being introduced.

Figure 4:
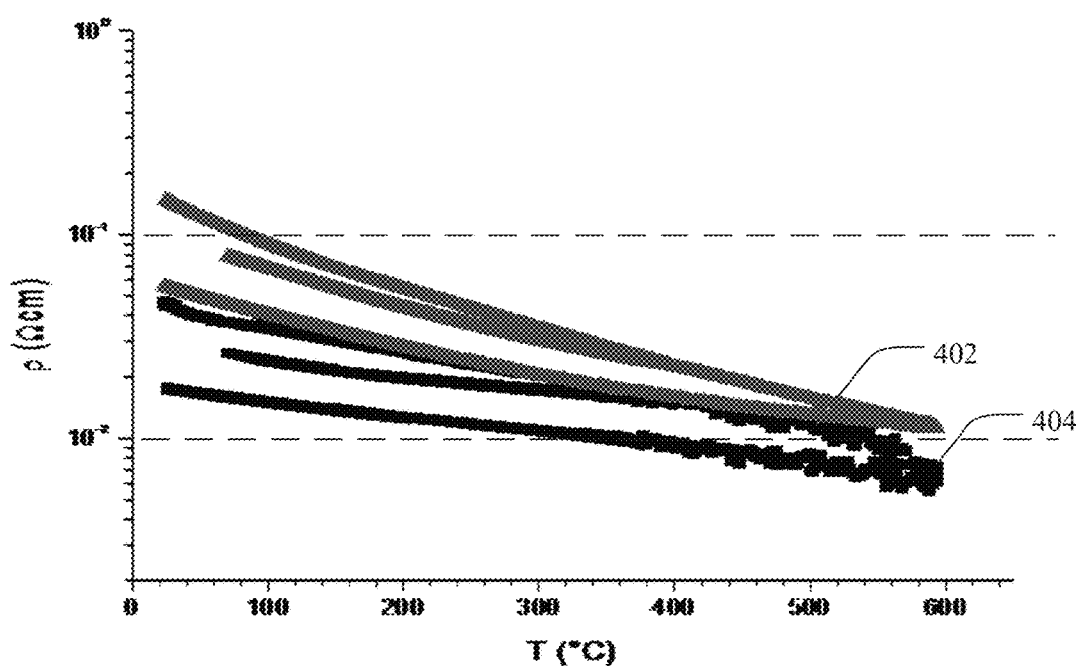
FIG. 4 is a graphical representation of data in accordance with an invention embodiment.

Furthermore, silicon-doped amorphous carbon shows a low resistivity (rho) vs. temperature sensitivity, and the final resistivity can be fine-tuned into a desired range by altering the silicon content of the material. FIG. 4 shows examples of two materials having different silicon content measured for resistivity over a range of temperatures. SiC 3-97 (402) is comprised of 3 at % of silicon and 97 at % of carbon, and SiC 7-93 (404) is comprised of 7 at % of silicon and 93 at % carbon. This comparison demonstrates that altering the silicon content can shift or tune the resistive properties of an electrode material.

Figure 5:
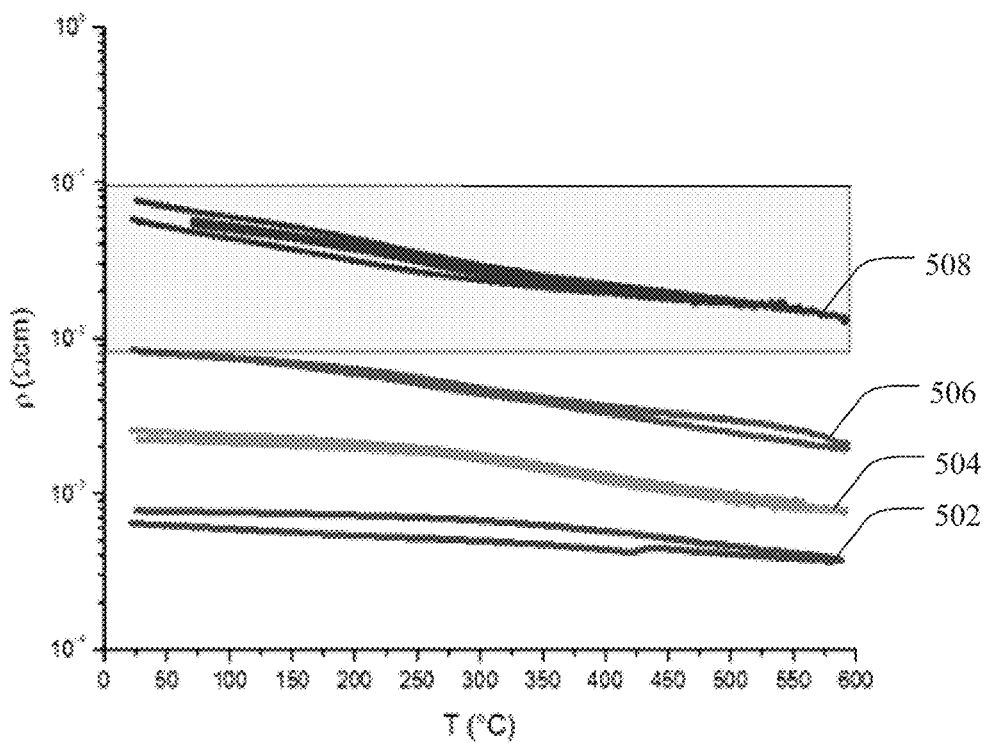
FIG. 5 is a graphical representation of data in accordance with an invention embodiment.

In another example, the doped electrode material can be a nitrogen-doped tungsten silicide (WSi$_x$, e.g. tungsten silicide, tungsten disilicide, etc.) material. Various tungsten to silicon ratios are contemplated and any useful material composition is considered to be within the present scope. In one example the tungsten silicide material can have an at % tungsten to silicon ratio of from about 1:3 to about 1:5. In another example, the tungsten silicide material can have an at % tungsten to silicon ratio of about 1:4. Such nitrogen-doped electrode materials exhibit enhanced or improved stability under thermal treatment at temperatures close to what can be experienced in a functioning phase change memory cell. Such materials show a drop in resistivity after thermal budget of about a factor of about 10 compared to a factor of about 100 for amorphous carbon. As is shown in FIG. 5, the doped electrode material can be tuned to achieve a desired resistivity, and as such, the material can maintain the desired resistivity from the as-deposited state to the after-manufactured state, and further through many thousands of programming cycles. FIG. 5 shows several tungsten silicide materials having differing levels of nitrogen doping, measured as the nitrogen flow rate during deposition of the material. Material A 502 is undoped tungsten silicide, Material B 504 is nitrogen doped with a flow rate of 20 sccm, Material C 506 is nitrogen doped with a flow rate of 30 sccm, and Material D 508 is nitrogen doped with a flow rate of 40 sccm. The shaded box shows a reference resistivity of from 10 to 100 mOhm·cm. Thus, the content of the nitrogen in the tungsten silicide can be varied to tune the material to a desired resistivity range, which, as can be seen in FIG. 5, is maintained across the tested temperatures.

The nitrogen-doping profile can thus vary depending on the desired properties of the resultant tungsten silicide material. In one example, the nitrogen is present at a flowrate of from about 20 sccm to about 60 sccm during formation of the electrode material. In another example, the nitrogen is present at a flowrate of about 40 sccm during formation of the electrode material.

In another example, the doped electrode material can be a tungsten-doped silicon carbide material. Various silicon to carbon ratios are contemplated and any useful material composition is considered to be within the present scope. In one example the silicon carbide material can include silicon at a concentration of up to 95 at %. In another example, the silicon carbide material can include silicon at a concentration of up to 50 at %. Additionally, in some examples the silicon carbide material has an at % silicon to carbon ratio of from about 99:1 to about 1:99. In other examples, the silicon carbide material has an at % silicon to carbon ratio of from about 1:1 to about 1:99. In yet other examples, the silicon carbide material has an at % silicon to carbon ratio of from about 1:1 to about 1:9. Tungsten can be doped into the silicon carbide material in any concentration that results in an electrode material having desirable properties. In one example, however, the tungsten can be doped into the silicon carbide material up to about 20 at %. In another example, the tungsten can be doped in the silicon carbide material up to about 15 at %.

Figure 6:
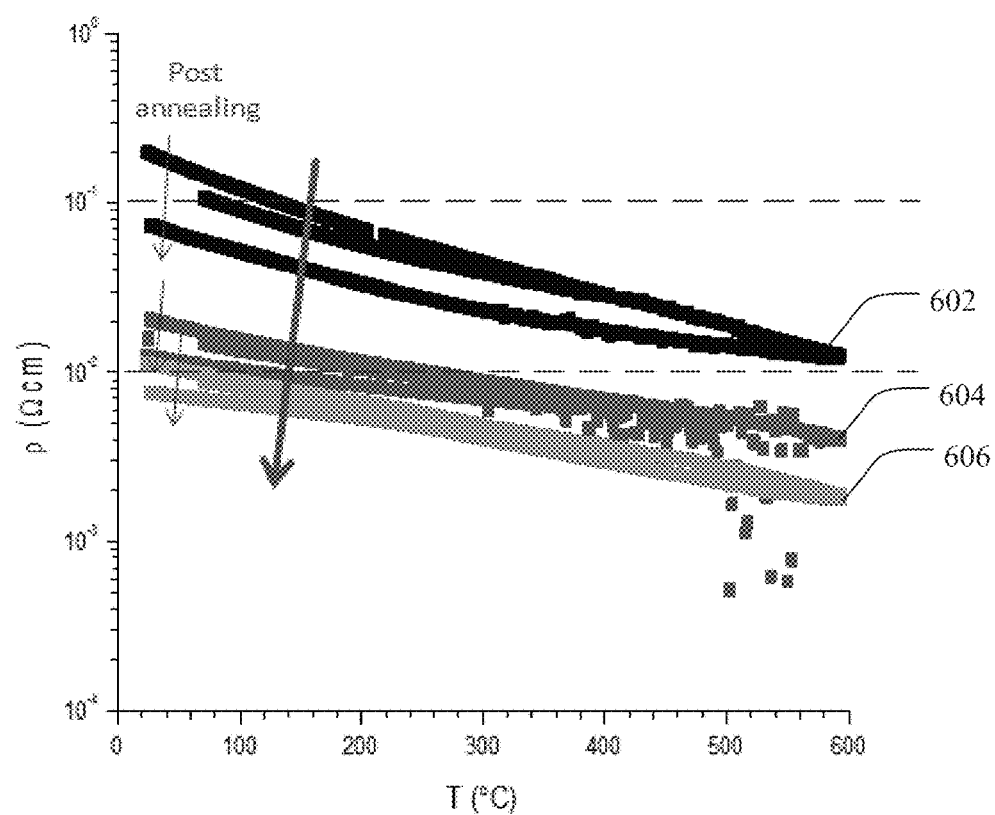
FIG. 6 is a graphical representation of data in accordance with an invention embodiment.
Figure 7:
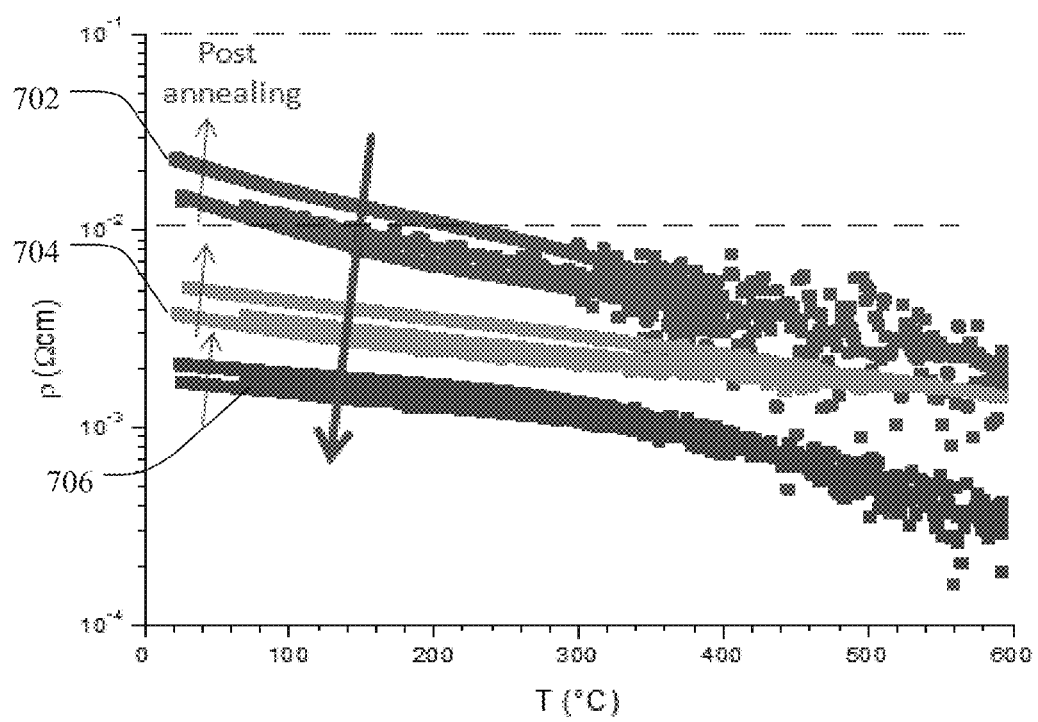
FIG. 7 is a graphical representation of data in accordance with an invention embodiment.

Furthermore, the electrode material can be tuned to achieve desired resistivity properties through varying the degree of tungsten doping. As such, a tungsten-doped silicon carbide electrode can have resistivity values in a desired range as deposited, and maintained in the desired range through the manufacturing process and following many thousands of programming operations, due to the thermal stability of the material. FIG. 6 shows an example of resistivity measurements from three silicon carbide materials having an at % silicon to carbon ratio of about 1:9 with varying degrees of tungsten doping. Material A 602 has no tungsten doping, Material B 604 has tungsten doping of about 1 at %, and Material C 606 has a tungsten doping of about 2 at %. Thus the degree of tungsten doping can tune the silicon carbide material to a desired resistivity range. FIG. 7 shows resistivity measurements from three silicon carbide materials having an at % silicon to carbon ratio of about 1:1 and varying tungsten doping. Material A 702 has a tungsten doping of about 3 at %, Material B 704 has a tungsten doping of about 6 at %, and Material C 706 has a tungsten doping of about 9 at %.

The various electrode materials described can be made according to any technique capable of forming such materials, and any such technique is considered to be within the present scope. Those skilled in the art can readily contemplate appropriate manufacturing techniques for the various materials, as well as the various conditions for tuning of a given material, once in possession of the present disclosure. In one example, the electrode materials can be made by PVD deposition, such as by co-sputtering using multiple PVD targets. For nitrogen doping, such co-sputtering can occur in the presence of nitrogen. During the sputtering process, molecular $N_2$ can be introduced into the PVD chamber to allow nitrogen to be incorporated into the electrode material. PVD targets can also be used to introduce a dopant into the forming electrode material. It is additionally contemplated that a dopant can be introduced into an electrode material following deposition by any available technique, such as, for example, ion implantation.

As a general description of various PVD details, one design can utilize a PVD chamber that is maintained under vacuum. In some cases the PVD chamber can include two primary parts: a pedestal used to hold a substrate in position, and a source or target made from the material to be sputtered onto the substrate. The target can be made of a single element, or an alloy or mixture of elements. An electrical power generator is generally connected between target (cathode, negative polarity) and ground.

Regarding the operation of a typical PVD process, the chamber is filled with a gas such as Ar, often kept at a low pressure (e.g. 0.1-100 mTorr). Upon activation of the power generator, some of the Ar atoms inside the chamber are ionized (Ar-->Ar+/e−) and form a plasma. The Ar+ ions, (cations) are attracted by the target, which is negatively charged, and thus move toward and impact the target surface. If the transferred energy is sufficiently high, the ionized Ar+ breaks the target material into atoms/clusters and sputters them onto the substrate surface. Depending on the properties of materials to be sputtered, the power source may be DC (direct/continuous current), DC-pulsed (a DC current with a periodic polarity inversion, for example), or RF (radio-frequency). A DC source applies a constant power to the target, and is often used sputter metals and good conductive alloys onto the substrate. A DC-pulsed source it is often used for elements/compounds that are not good electrical conductors (e.g. Carbon, chalcogenide alloys, etc.). The polarity inversion of the voltage applied by generator can be used to clear the target surface of residual electrical charges. RF sources apply a sinusoidal voltage with the typical RF frequency (e.g. 13.56 MHz). The sinusoidal fluctuation is also used to clear the target surface of residual charges. RF power sources are often used to sputter insulating materials on a substrate (e.g. oxides).

As has been described, $N_2$ can be flowed through the chamber during the sputtering process along with the Ar to facilitate the introduction of N into the electrode material. The process is often referred to as "reactive sputtering," and the amount of N added can be dependent on the material composition being formed and on the amount of N flown inside the chamber. Thus, as the electrode material is sputtered onto the substrate, $N_2$ is ionized and N is incorporated into the forming material.

The phase change material can include any useful material having a detectable change in phase. Examples of such a materials include any of a variety of chalcogenide alloys, including, without limitation, Ge—Te, In—Se, Sb—Te, Ge—Sb, Ga—Sb, In—Sb, As—Te, Al—Te, Ge—Sb—Te, Te—Ge—As, In—Sb—Te, In—Se—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among others. The hyphenated chemical composition notation, as used herein, indicates the elements included in a particular mixture or compound, e.g., chalcogenide alloy, and is intended to represent all stoichiometries involving the indicated elements, e.g., $Ge_xSb_yTe_z$ having variations in stoichiometries, such as $Ge_2Sb_2Te_5$, $Ge_2Sb_2Te_7$, $Ge_1Sb_2Te_4$, $Ge_1Sb_4Te_7$, etc., to form a gradient.

In yet another example, a method of forming a phase change memory structure is provided. Such a method can include forming a first, second, and third electrode with a phase change material disposed between the first and second electrode and a select device material disposed between the second and third electrode, where at least one of the first, second, or third electrodes includes a doped electrode material having a resistivity of from 10 to 100 mOhm·cm as formed. In one example, the doped electrode material is formed by depositing amorphous carbon and doping with silicon. In another example, the doped electrode material is formed by co-sputtering tungsten and silicon in a nitrogen gas environment at a partial pressure sufficient for nitrogen doping. In another example, the doped electrode material is formed by depositing a silicon carbide material and doping with tungsten.

Figure 8:
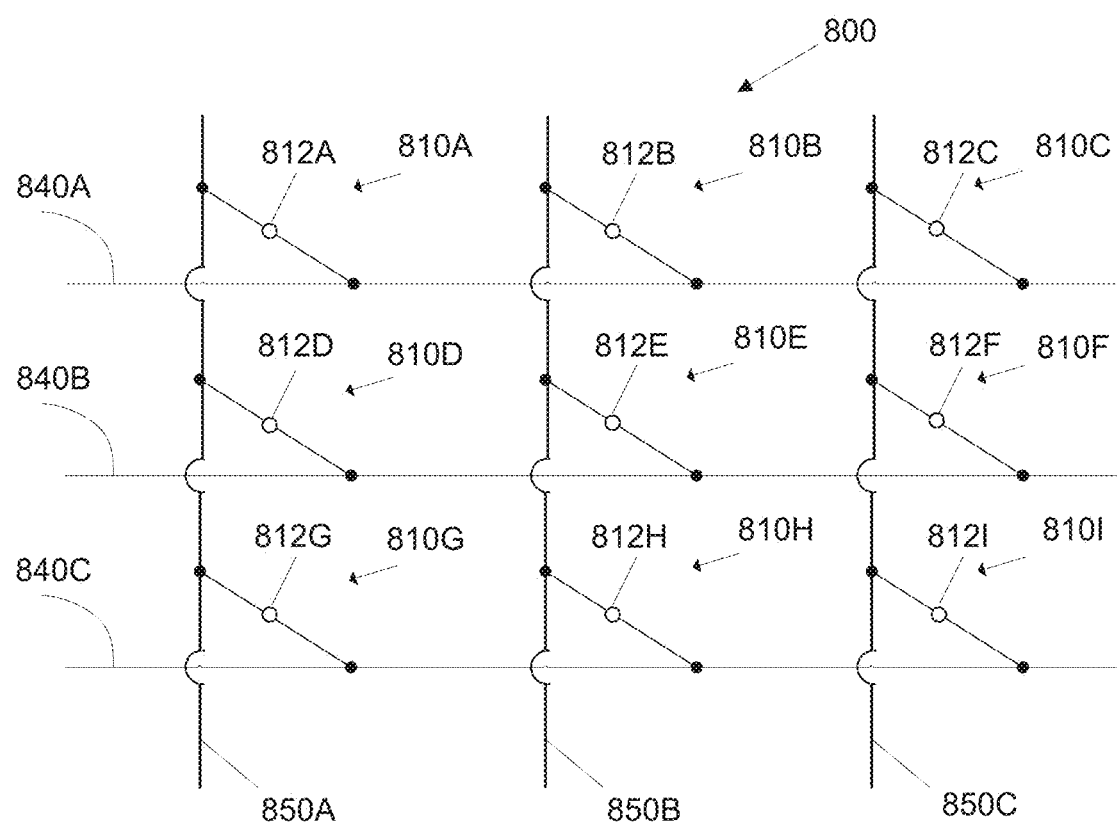
FIG. 8 is a schematic view of an embodiment of a phase change memory array or system that includes phase change memory cells in accordance with an invention embodiment.

FIG. 8 shows a schematic view of an embodiment of a phase change memory array 800 or system. The array includes, for illustration purposes, a 3×3 array of memory cells 810A-810I. Each memory cell (810A-810I) may include a phase change material or element, along with any other typical materials or structures required of a phase change memory cell. In one embodiment, one or more, or all, of the phase change cells can include the materials and structures depicted in FIG. 2, or a portion thereof. The memory array 800 may include column lines 850A-C and row lines 840A-C to select a particular memory cell of the array or system during a write or read operation. The column lines 850A-C and the row lines 840A-C may also be referred to as "address lines" since these lines may be used to address memory cells 810A-I during programming or reading. The column lines 850A-C may also be referred to as "bit lines", and the row lines 840A-C may also be referred to as "word lines". Further, it is understood that the 3×3 array of FIG. 8 is merely exemplary and may be any appropriate size (i.e. any number of memory cells).

The phase change memory elements 812A-I may be connected to the column lines 850A-C and may be coupled to the row lines 840A-C. Switches such as ovonic switches as well as capacitors, junctions, or other features or structures (not shown) as desired may be used in the memory array or system 800. Operation of the memory array or system 800 proceeds according to standard operation for such a phase change memory device, by application of current through column and row lines, etc.

EXAMPLES

The following examples pertain to further embodiments.

In one example there is provided a phase change memory structure, comprising:

a phase change material of a memory cell;

an electrode material forming an Ohmic contact with the phase change material; and a dopant dispersed within the electrode material that provides the electrode material with a resistivity of from about 10 to about 100 mOhm·cm.

In one example, the doped electrode material has a resistivity of from about 10 to about 100 mOhm·cm as formed.

In one example, the doped electrode material has a resistivity of from about 10 to about 100 mOhm·cm when measured at a temperature of about 600° C.

In one example, the doped electrode material has a resistivity of from about 10 to about 100 mOhm·cm when measured at a temperature of about 20° C.

In one example, the doped electrode material has a resistivity of from about 10 to about 100 mOhm·cm when measured at a temperature of from about 400° C. to about 800° C.

In one example, the doped electrode material has a resistivity of from about 10 to about 100 mOhm·cm when measured at a temperature of from about 20° C. to about 400° C.

In one example, the doped electrode material has a resistivity of from about 10 to about 100 mOhm·cm when measured at a temperature of about 20° C. and a temperature of about 600° C.

In one example, the doped electrode has a resistivity of from about 10 to about 100 mOhm·cm following manufacturing.

In one example, the doped electrode has a resistivity of from about 10 to about 100 mOhm·cm following a 3 hour 400° C. anneal.

In one example, the doped electrode has a resistivity of from about 10 to about 100 mOhm·cm following a 3 hour 500° C. anneal.

In one example, the doped electrode has a resistivity of from about 10 to about 100 mOhm·cm following at least 1000 write and erase cycles.

In one example, the electrode material is a member selected from the group consisting of: amorphous carbon, tungsten silicide (WSi), and silicon carbide (SiC).

In one example, the electrode material is amorphous carbon and the dopant is silicon.

In one example, the silicon is doped in the amorphous carbon up to about 20 at %.

In one example, the silicon is doped in the amorphous carbon from about 5 at % to about 10 at %.

In one example, the electrode material is tungsten silicide and the dopant is nitrogen.

In one example, the electrode material has an at % tungsten to silicon ratio of from about 1:3 to about 1:5.

In one example, the electrode material has an at % tungsten to silicon ratio of about 1:4.

In one example, the electrode material is formed in the presence of nitrogen sufficient to form the doped electrode material.

In one example, the nitrogen is present at a flowrate from about 20 sccm to about 60 sccm during formation of the electrode material.

In one example, the nitrogen is present at a flowrate of about 40 sccm during formation of the electrode material.

In one example, the electrode material is a silicon carbide material and the dopant is tungsten.

In one example, silicon is present in the silicon carbide material at a concentration of up to about 95 at %.

In one example, silicon is present in the silicon carbide material at a concentration of up to about 50 at %.

In one example, the silicon carbide material has an at % silicon to carbon ratio of from about 1:1 to about 1:9.

In one example, the tungsten is doped in the silicon carbide material up to about 20 at %.

In one example, the tungsten is doped in the silicon carbide material up to about 15 at %.

In one example there is provided a phase change memory cell, comprising:
 a stack structure including:
 a first electrode;
 a second electrode;
 a phase change material disposed between and forming Ohmic contacts with the first electrode and the second electrode;
 a third electrode; and
 a select device material disposed between the third electrode and the second electrode;
 wherein at least one of the first, second, or third electrodes includes an electrode material doped to have a resistivity of from about 10 to about 100 mOhm·cm.

In one example, at least the first and second electrodes include the doped electrode material.

In one example, the doped electrode material is amorphous carbon doped with silicon.

In one example, the doped electrode material is tungsten silicide doped with nitrogen.

In one example, the doped electrode material is silicon carbide doped with tungsten.

In one example there is provided a method of forming a phase change memory structure, comprising:
 forming a first, second, and third electrode with a phase change material disposed between the first and second electrode and a select device material disposed between the second and third electrode, wherein at least one of the first, second, or third electrodes includes a doped electrode material having a resistivity of from 10 to 100 mOhm·cm.

In one example, the doped electrode material is formed by depositing amorphous carbon and doping with silicon.

In one example, the silicon is doped in the amorphous carbon up to about 20 at %.

In one example, the silicon is doped in the amorphous carbon from about 5 at % to about 10 at %.

In one example, the doped electrode material is formed by co-sputtering tungsten and silicon in a nitrogen gas environment at a partial pressure sufficient for nitrogen doping.

In one example, the nitrogen is present during co-sputtering at a flowrate from 20 sccm to 60 sccm.

In one example, the nitrogen is present during co-sputtering at a flowrate of 40 sccm.

In one example, the doped electrode material is formed by depositing a silicon carbide material and doping with tungsten.

In one example, the tungsten is doped in the silicon carbide material up to 20 at %.

In one example, the tungsten is doped in the silicon carbide material up to 15 at %.

In one exampler there is provided a method of making an electrode for a phase change memory structure comprising:
 providing an electrode material;
 doping the electrode material to provide the electrode material with a resistivity of from 10 to 100 mOhm·cm; and
 including the doped electrode material adjacent to a phase change material in the memory structure.

In one example, the doped electrode material has a resistivity of from about 10 to about 100 mOhm·cm when measured at a temperature of about 600° C.

In one example, the doped electrode material has a resistivity of from about 10 to about 100 mOhm·cm when measured at a temperature of about 20° C.

In one example, the doped electrode material has a resistivity of from about 10 to about 100 mOhm·cm when measured at a temperature of from about 400° C. to about 800° C.

In one example, the doped electrode material has a resistivity of from about 10 to about 100 mOhm·cm when measured at a temperature of from about 20° C. to about 400° C.

In one example, the doped electrode material has a resistivity of from about 10 to about 100 mOhm·cm when measured at a temperature of about 20° C. and a temperature of about 600° C.

In one example, the doped electrode has a resistivity of from about 10 to about 100 mOhm·cm following a 3 hour 400° C. anneal.

In one example, the doped electrode has a resistivity of from about 10 to about 100 mOhm·cm following a 3 hour 500° C. anneal.

In one example, the doped electrode has a resistivity of from about 10 to about 100 mOhm·cm following at least 1000 write and erase cycles.

In one example, the electrode material is a member selected from the group consisting of: amorphous carbon, tungsten silicide (WSi), and silicon carbide (SiC).

In one example, the electrode material is amorphous carbon and the dopant is silicon.

In one example, the silicon is doped in the amorphous carbon up to about 20 at %.

In one example, the silicon is doped in the amorphous carbon from about 5 at % to about 10 at %.

In one example, the electrode material is tungsten silicide and the dopant is nitrogen.

In one example, the electrode material has a tungsten to silicon ratio of from about 1:3 to about 1:5.

In one example, the electrode material has an at % tungsten to silicon ratio of about 1:4.

In one example, the electrode material is formed in the presence of nitrogen sufficient to form the doped electrode material.

In one example, the nitrogen is present at a flowrate from about 20 sccm to about 60 sccm during formation of the electrode material.

In one example, the nitrogen is present at a flowrate of about 40 sccm during formation of the electrode material.

In one example, the electrode material is a silicon carbide material and the dopant is tungsten.

In one example, silicon is present in the silicon carbide material at a concentration of up to about 95 at %.

In one example, silicon is present in the silicon carbide material at a concentration of up to about 50 at %.

In one example, the silicon carbide material has an at % silicon to carbon ratio of from about 1:1 to about 1:9.

In one example, the tungsten is doped in the silicon carbide material up to about 20 at %.

In one example, the tungsten is doped in the silicon carbide material up to about 15 at %.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts expressed herein.

What is claimed is:

1. A memory cell comprising:
   a memory element between a first conductive line and a second conductive line;
   a select device between the memory element and the first conductive line;
   a first electrode between the select device and the first conductive line, the first electrode including amorphous carbon doped with silicon;
   a second electrode between the memory element and the second conductive line, the second electrode including amorphous carbon doped with silicon; and
   a third electrode between the memory element and the select device, the third electrode including amorphous carbon doped with silicon.

2. The memory cell of claim 1, wherein:
   one or more of the first electrode and the second electrode include up to 20 atomic percent (at %) silicon.

3. The memory cell of claim 1, wherein:
   one or more of the first electrode and the second electrode include silicon in a range of 5-10 atomic percent (at %).

4. The memory cell of claim 1, wherein:
   one or more of the first electrode and the second electrode include approximately 3 atomic percent (at %) silicon.

5. The memory cell of claim 1, wherein:
   one or more of the first electrode and the second electrode include approximately 7 atomic percent (at %) silicon.

6. The memory cell of claim 1, wherein:
   the memory element includes a chalcogenide material.

7. The memory cell of claim 6, wherein:
   the chalcogenide material includes germanium (Ge), antimony (Sb), and tellurium (Te).

8. The memory cell of claim 1, wherein:
   the memory element includes a phase change material.

9. The memory cell of claim 1, wherein:
   the select device includes a chalcogenide material.

10. The memory cell of claim 1, wherein:
    the select device includes a different material than the memory element.

11. The memory cell of claim 1, wherein:
    the first conductive line comprises a wordline; and
    the second conductive line comprises a bitline.

12. A memory device comprising:
    a crosspoint array of memory cells, each of the memory cells comprising:
      a first chalcogenide material between a first conductive line and a second conductive line;
      a second chalcogenide material between the first chalcogenide material and the first conductive line;
      a first electrode material between the first chalcogenide material and the first conductive line, the first electrode material including amorphous carbon doped with silicon;
      a second electrode material between the first chalcogenide material and the second conductive line, the second electrode material including amorphous carbon doped with silicon; and
      a third electrode material between the first chalcogenide material and the second chalcogenide material, the third electrode material including amorphous carbon doped with silicon.

13. The memory device of claim 12, wherein:
    one or more of the first electrode material and the second electrode material include up to 20 atomic percent (at %) silicon.

14. The memory device of claim 12, wherein:
    one or more of the first electrode material and the second electrode material include silicon in a range of 5-10 atomic percent (at %).

15. The memory device of claim 12, wherein:
    one or more of the first electrode material and the second electrode material include approximately 3 atomic percent (at %) silicon.

16. A memory device comprising:
    an array of memory cells, each of the memory cells comprising:
      a phase change material between a first conductive line and a second conductive line;
      a first electrode material between the phase change material and the first conductive line, the first electrode material including amorphous carbon doped with silicon; and
      a second electrode material between the phase change material and the second conductive line, the second electrode material including amorphous carbon doped with silicon.

17. The memory device of claim 16, wherein each of the memory cells further comprises:
    a select material between the phase change material and the first conductive line; and
    a third electrode material between the phase change material and the select material, the third electrode material including amorphous carbon doped with silicon.

* * * * *